(12) United States Patent
Roberts et al.

(10) Patent No.: US 11,624,764 B1
(45) Date of Patent: Apr. 11, 2023

(54) FLANGE MOUNT COAXIAL CONNECTOR SYSTEM

(71) Applicant: ANRITSU COMPANY, Morgan Hill, CA (US)

(72) Inventors: Thomas H Roberts, Morgan Hill, CA (US); Jon Martens, San Jose, CA (US); Jim Mallette, Morgan Hill, CA (US); Anthony Vega, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 251 days.

(21) Appl. No.: 16/906,972

(22) Filed: Jun. 19, 2020

Related U.S. Application Data

(60) Provisional application No. 62/863,705, filed on Jun. 19, 2019.

(51) Int. Cl.
| | | |
|---|---|---|
| *G01R 27/28* | (2006.01) | |
| *H01R 13/631* | (2006.01) | |
| *H01R 24/54* | (2011.01) | |
| *H01R 103/00* | (2006.01) | |
| *H01R 13/64* | (2006.01) | |

(52) U.S. Cl.
CPC ........... *G01R 27/28* (2013.01); *H01R 13/631* (2013.01); *H01R 24/54* (2013.01); *H01R 13/64* (2013.01); *H01R 2103/00* (2013.01)

(58) Field of Classification Search
CPC ...... G01R 27/28; H01R 13/631; H01R 24/54; H01R 2103/00; H01R 13/64
See application file for complete search history.

(56) References Cited

U.S. PATENT DOCUMENTS

| | | |
|---|---|---|
| 5,801,525 A | 9/1998 | Oldfield |
| 5,812,039 A | 9/1998 | Oldfield |
| 5,909,192 A | 6/1999 | Finch |

(Continued)

FOREIGN PATENT DOCUMENTS

| | | | | |
|---|---|---|---|---|
| GB | 2423649 A | * | 8/2006 | .............. H01P 1/045 |

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.

(Continued)

*Primary Examiner* — Travis S Chambers
(74) *Attorney, Agent, or Firm* — Kilpatrick Townsend & Stockton, LLP

(57) ABSTRACT

Improved coaxial connectors and methods which have enhanced characteristics, reliability, strength, and durability. This coaxial connector system uses a flange mating system and a single slot male pin center conductor contact. The flanges use precision guiding pins and screws to axially align and secure the mating flanges together. The coaxial center conductors are electrically connected to each other by a resilient, single slotted, formed male pin and a female receptacle as center conductor assemblies. When the two flanges are fastened together, the center conductor assemblies (formed male pin and a female receptacle) mate to form an electrically conducting connection.

9 Claims, 6 Drawing Sheets

(56) References Cited

U.S. PATENT DOCUMENTS

| | | | |
|---|---|---|---|
| 5,977,779 A | 11/1999 | Bradley | |
| 6,049,212 A | 4/2000 | Oldfield | |
| 6,291,984 B1 | 9/2001 | Wong | |
| 6,316,945 B1 | 11/2001 | Kapetanic | |
| 6,331,769 B1 | 12/2001 | Wong | |
| 6,496,353 B1 | 12/2002 | Chio | |
| 6,504,449 B2 | 1/2003 | Constantine | |
| 6,509,821 B2 | 1/2003 | Oldfield | |
| 6,525,631 B1 | 2/2003 | Oldfield | |
| 6,529,844 B1 | 3/2003 | Kapetanic | |
| 6,548,999 B2 | 4/2003 | Wong | |
| 6,650,123 B2 | 11/2003 | Martens | |
| 6,665,628 B2 | 12/2003 | Martens | |
| 6,670,796 B2 | 12/2003 | Mori | |
| 6,680,679 B2 | 1/2004 | Stickle | |
| 6,700,366 B2 | 3/2004 | Truesdale | |
| 6,700,531 B2 | 3/2004 | Abou-Jaoude | |
| 6,714,898 B1 | 3/2004 | Kapetanic | |
| 6,766,262 B2 | 7/2004 | Martens | |
| 6,832,170 B2 | 12/2004 | Martens | |
| 6,839,030 B2 | 1/2005 | Noujeim | |
| 6,882,160 B2 | 4/2005 | Martens | |
| 6,888,342 B2 | 5/2005 | Bradley | |
| 6,894,581 B2 | 5/2005 | Noujeim | |
| 6,917,892 B2 | 7/2005 | Bradley | |
| 6,928,373 B2 | 8/2005 | Martens | |
| 6,943,563 B2 | 9/2005 | Martens | |
| 7,002,517 B2 | 2/2006 | Noujeim | |
| 7,011,529 B2 | 3/2006 | Oldfield | |
| 7,016,024 B2 | 3/2006 | Bridge | |
| 7,019,510 B1 | 3/2006 | Bradley | |
| 7,054,776 B2 | 5/2006 | Bradley | |
| 7,068,046 B2 | 6/2006 | Martens | |
| 7,088,111 B2 | 8/2006 | Noujeim | |
| 7,108,527 B2 | 9/2006 | Oldfield | |
| 7,126,347 B1 | 10/2006 | Bradley | |
| 7,131,873 B2* | 11/2006 | Miyake | H01R 13/64 439/680 |
| 7,173,423 B2 | 2/2007 | Buchwald | |
| 7,284,141 B2 | 10/2007 | Stickle | |
| 7,304,469 B1 | 12/2007 | Bradley | |
| 7,307,493 B2 | 12/2007 | Feldman | |
| 7,509,107 B2 | 3/2009 | Bradley | |
| 7,511,577 B2 | 3/2009 | Bradley | |
| 7,521,939 B2 | 4/2009 | Bradley | |
| 7,545,151 B2 | 6/2009 | Martens | |
| 7,683,602 B2 | 3/2010 | Bradley | |
| 7,683,633 B2 | 3/2010 | Noujeim | |
| 7,705,582 B2 | 4/2010 | Noujeim | |
| 7,746,052 B2 | 6/2010 | Noujeim | |
| 7,764,141 B2 | 7/2010 | Noujeim | |
| 7,872,467 B2 | 1/2011 | Bradley | |
| 7,924,024 B2 | 4/2011 | Martens | |
| 7,957,462 B2 | 6/2011 | Aboujaoude | |
| 7,983,668 B2 | 7/2011 | Tiernan | |
| 8,027,390 B2 | 9/2011 | Noujeim | |
| 8,058,880 B2 | 11/2011 | Bradley | |
| 8,145,166 B2 | 3/2012 | Barber | |
| 8,156,167 B2 | 4/2012 | Bradley | |
| 8,159,208 B2 | 4/2012 | Brown | |
| 8,169,993 B2 | 5/2012 | Huang | |
| 8,185,078 B2 | 5/2012 | Martens | |
| 8,278,944 B1 | 10/2012 | Noujeim | |
| 8,294,469 B2 | 10/2012 | Bradley | |
| 8,305,115 B2 | 11/2012 | Bradley | |
| 8,306,134 B2 | 11/2012 | Martens | |
| 8,410,786 B1 | 4/2013 | Bradley | |
| 8,417,189 B2 | 4/2013 | Noujeim | |
| 8,457,187 B1 | 6/2013 | Aboujaoude | |
| 8,493,111 B1 | 7/2013 | Bradley | |
| 8,498,582 B1 | 7/2013 | Bradley | |
| 8,538,350 B2 | 9/2013 | Varjonen | |
| 8,593,158 B1 | 11/2013 | Bradley | |
| 8,629,671 B1 | 1/2014 | Bradley | |
| 8,630,591 B1 | 1/2014 | Martens | |
| 8,666,322 B1 | 3/2014 | Bradley | |
| 8,718,586 B2 | 5/2014 | Martens | |
| 8,760,148 B1 | 6/2014 | Bradley | |
| 8,816,672 B1 | 8/2014 | Bradley | |
| 8,816,673 B1 | 8/2014 | Barber | |
| 8,884,664 B1 | 11/2014 | Bradley | |
| 8,903,149 B1 | 12/2014 | Noujeim | |
| 8,903,324 B1 | 12/2014 | Bradley | |
| 8,942,109 B2 | 1/2015 | Dorenbosch | |
| 9,103,856 B2 | 8/2015 | Brown | |
| 9,103,873 B1 | 8/2015 | Martens | |
| 9,153,890 B2 | 10/2015 | Warwick | |
| 9,176,174 B1 | 11/2015 | Bradley | |
| 9,176,180 B1 | 11/2015 | Bradley | |
| 9,210,598 B1 | 12/2015 | Bradley | |
| 9,239,371 B1 | 1/2016 | Bradley | |
| 9,287,604 B1 | 3/2016 | Noujeim | |
| 9,331,633 B1 | 5/2016 | Robertson | |
| 9,337,941 B2 | 5/2016 | Emerson | |
| 9,366,707 B1 | 6/2016 | Bradley | |
| 9,455,792 B1 | 9/2016 | Truesdale | |
| 9,560,537 B1 | 1/2017 | Lundquist | |
| 9,571,142 B2 | 2/2017 | Huang | |
| 9,588,212 B1 | 3/2017 | Bradley | |
| 9,594,370 B1 | 3/2017 | Bradley | |
| 9,606,212 B1 | 3/2017 | Martens | |
| 9,680,245 B2 | 6/2017 | Warwick | |
| 9,685,717 B2 | 6/2017 | Warwick | |
| 9,696,403 B1 | 7/2017 | Elder-Groebe | |
| 9,733,289 B1 | 8/2017 | Bradley | |
| 9,753,071 B1 | 9/2017 | Martens | |
| 9,768,892 B1 | 9/2017 | Bradley | |
| 9,860,054 B1 | 1/2018 | Bradley | |
| 9,964,585 B1 | 5/2018 | Bradley | |
| 9,967,085 B1 | 5/2018 | Bradley | |
| 9,977,068 B1 | 5/2018 | Bradley | |
| 10,003,453 B1 | 6/2018 | Bradley | |
| 10,006,952 B1 | 6/2018 | Bradley | |
| 10,064,317 B1 | 8/2018 | Bradley | |
| 10,116,432 B1 | 10/2018 | Bradley | |
| 2006/0223365 A1* | 10/2006 | Campbell | H05K 1/141 439/540.1 |

OTHER PUBLICATIONS

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE © 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions On Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions On Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

(56) References Cited

OTHER PUBLICATIONS

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions On Antennas and Propagation, vol. 64, No. 7, Jul. 2016, pp. 3130-3140.

Senic, Damir et al., "Radiated Power Based on Wave Parameters at Millimeter-wave Frequencies for Integrated Wireless Devices", IEEE © 2016, 4 pages.

\* cited by examiner

320

FLANGE MOUNT COAXIAL CONNECTOR SYSTEM

CLAIM OF PRIORITY

This application claims the benefit of priority to U.S. Provisional Application No. 62/863,705 filed Jun. 19, 2019 titled "FLANGE MOUNT COAXIAL CONNECTOR SYSTEM", which application is hereinafter incorporated by reference in its entirety.

TECHNICAL FIELD

The present invention relates generally to connector systems and interfaces for RF devices in general and vector network analyzer (VNA) systems in particular.

BACKGROUND

Conventional high frequency coaxial connector designs similar to those referenced in IEEE-STD-287 utilize a threaded outer conductor and pin/socket center conductor design. The threaded outer conductor allows two connectors to be securely mated together and slotted contacts allow a reliable and repeatable connection. Higher frequency coaxial connectors must reduce in size to prevent higher order modes from propagating. However, machining smaller size connector geometries, such as slotted female contacts, for frequencies beyond ~200 GHz becomes impractical commercially. Furthermore, reducing the size of threaded outer conductors (1) enforces a minimum connector length increasing the mechanical torque sensitivity on the connector system, (2) reduces the connectors overall strength, and (3) leads to reduced longevity and repeatability of the connector.

Waveguide is another transmission line medium used at millimeter-wave frequencies, but these structures are band limited. Flange-based connectors are possible using compressible contact points but these are more fragile, have higher series resistance (which may play a role in DC biasing through the connector (a common requirement for mm-wave measurements), and more likely to interact with cleaning solvents.

Accordingly, the conventional high frequency coaxial connectors are problematic. Accordingly, it is desirable to provide improved coaxial connectors and methods which have improved characteristics, reliability, strength, and durability. Further objects and advantages of the present invention will become apparent to those skilled in the art from the following detailed description of the various embodiments, when read in light of the accompanying drawings.

DETAILED DESCRIPTION

Figure 1A:
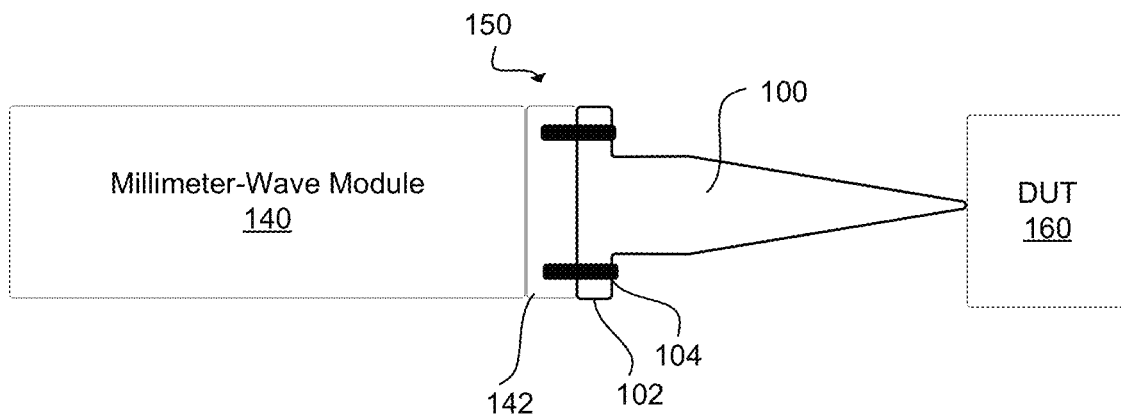
FIGS. 1A-1C illustrates a wafer probe, coaxial adapter and waveguide assembly mounted to a millimeter-wave module via a flange mount connector system according to embodiments.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Embodiments of the present invention provide improved coaxial connectors and methods which have improved characteristics, reliability, strength, and durability.

In particular, embodiments of the present invention provide a flange mount, frequency and mechanically scalable, DC coupled, millimeter wave coaxial broadband transmission line structure. Natively it maintains high performance from DC to hundreds of GHz, well beyond that possible with conventional coaxial structures. The structure also easily adapts to banded waveguide. This connector system is suitable for use in vector network analyzers (VNA) including for example, Anritsu's next generation Broadband VNA system.

A vector network analyzer (VNA) is a reflectometer-based electronic instrument that can be used to measure the frequency response (magnitude and phase) of a device under test (DUT) such as an electrical network, component, circuit, or sub-assembly. A VNA makes use of a frequency sweeping source or stimulus, directional couplers, and one or more receivers that provide ratioed amplitude and phase information such as reflection and transmission coefficients. As such, it is important to have reliable connections made to a DUT and such connections must be reliable, durable and effective over a wide range of frequencies.

Traditional resilient slotted contacts are characterized as female with one end having a longitudinal hole with four longitudinal slots. The female contact is made by drilling, slotting, crimping and heat treating. Typically, four slots are made using a thin slotting saw. This slotted structure forms a resilient contact with four resilient fingers often used in coaxial connector assemblies. The solid male pin engages this resilient contact. The female slotted contact retains its formed shape when disengaged. Drilling and slotting this type of resilient contact is not possible for small diameters. The four fingers of the slotted contact become very thin and weak due primarily to large percentage of material removed and limitations of slotting saw thickness.

This new coaxial connector system uses a flange mating system and a single slot male pin center conductor contact. The flanges use precision guiding pins and screws to axially align and secure the mating flanges together. The coaxial center conductors are electrically connected to each other by a resilient, single slotted, formed male pin and a female receptacle as center conductor assemblies. When the two flanges are fastened together, the center conductor assemblies (formed male pin and a female receptacle) mate to form an electrically conducting connection. The resilient slotted male pin contact compresses and maintains a DC connection with the mating center conductor through spring-like tension. When the assemblies are disconnected, the resilient, single slotted, formed male pin retains or 'springs-back' to its original shape.

Unlike threaded outer conductor coaxial connector systems, the flange mount coaxial connector system flange of the present invention provides a robust, mechanically stable mount which minimizes electrical performance changes with mechanical torque (torque sensitivity) due to heavy devices under test (DUT) attached to the connector system. The non-rotational mating interface is more reliable and durable because, unlike conventional connectors, there is no mating interface wear due to rotating outer and center conductors against mating connector parts. Moreover, interface adapters can be easily constructed to lower frequency coaxial connectors and to (banded) waveguides.

The flange mount slotted pin coaxial connection interface provides many benefits. Connection repeatability is improved over traditional threaded connectors since there are only two rotational positions that the flanges could mate: 0 and 180°. This is substantially different than a conventional threaded type coaxial connector which has an infinite number of rotational mating positions. Precise axial alignment of mating interfaces—uses four precision alignment guide pins and four 4-40 screws. The interface is mateable to UG-387U and IEEE-1785-2a waveguide flange interfaces. The interface is mechanically rugged and electrical changes due to torque induced mechanical stress of DUTs are eliminated. The flange parts are physically short, exhibit low electrical loss and are easy to machine and hold dimensional tolerances. There is low connection insertion/withdraw force required for the resilient slotted pin: <5 g max, which results in less force on bead/center conductor capture and simplifies design. Additionally, a DC path for high pass connected structures is not required. Since a DC path is not necessary, un-slotted 'slip-fit' pin contacts are sufficient. In various embodiments, it is simple to connect single piece, Coax-to-Waveguide in-line transition shim adapters+standard UG-387U and IEEE-1785-2a WR5, WR6 and WR8 waveguide adapters, and similar components.

Features of the flange mount slotted pin coaxial connection interface include the following. A formed single slot male pin contact to electrically connect two center conductors of the same diameter to form a continuous impedance TEM transmission line structure with minimum signal reflection. The mating flanges provide a continuous ground between both a coaxial-to-coaxial connection, and a coaxial-to-waveguide connection. All flanged interfaces are dowel pin aligned and secured with 4-40 captive screws. Over torqueing the 4-40 screws will not damage or wear internal coaxial structures. Unlike traditional threaded connector interfaces. The flange allows for a rugged interface insensitive to mechanical torque or stress at interface by a mated connector or DUT. The flange mount coaxial interface allows standard UG-387U and IEEE-1785-2a flanges to be connected to it.

Figure 1B:
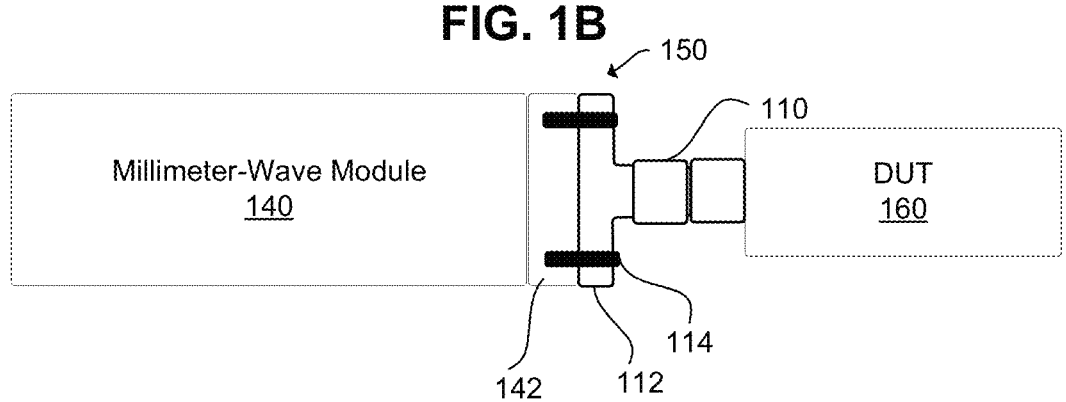
Figure 1C:
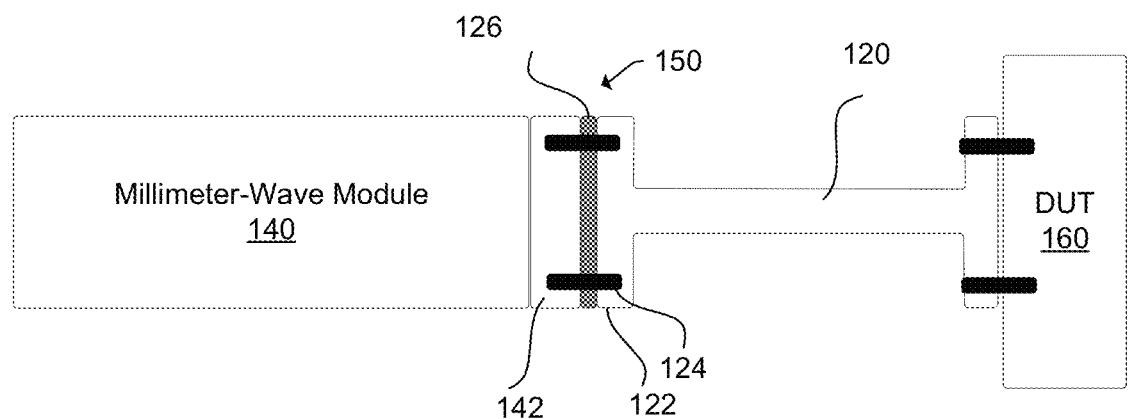
Figure 4A:
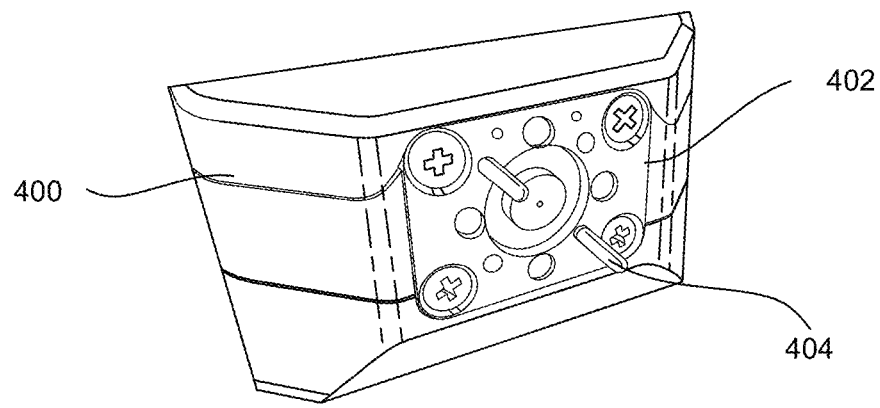
FIGS. 4A-4C illustrates assembly of a mode transition shim and waveguide assembly with a flange mount connector system of a millimeter-wave module according to an embodiment.

FIGS. 1A-1C illustrates a wafer probe 100, coaxial adapter 110 and waveguide 120 assembly mounted to a millimeter-wave module 140 via a flange mount connector system 150 according to embodiments. The wafer probe 100, coaxial adapter 110 and waveguide 120 may be used to couple the millimeter wave module to a device under test (DUT) 160. As shown in each of FIGS. 1A-1C the wafer probe 100, coaxial adapter 110, and waveguide 120 assembly each include a flange 102, 112, 122, and a pair of pins 104, 114, 124 which mate with a corresponding structure on the interface 142 of millimeter-wave module 140. As shown in FIG. 4A the interface of the millimeter wave module also includes a surface to engage the flange the surface has protruding pins which engage bores in the flanges of the wafer probe 100, coaxial adapter 110, and waveguide 120. All flanged interfaces are dowel pin aligned and secured with 4-40 captive screws (not shown). Precise axial alignment of mating interfaces—uses four precision alignment guide pins—two on the flange which mate with bores on the interface and two on the interface which mate with bores in the flange. The pins and bores of the interface can be seen in FIG. 4A for example. The interface of the millimeter wave module has threaded bores to receive the screws.

A coaxial connector flange system allows attachment of single piece, coaxial to waveguide mode transition flange shim 126. These shims facilitate a transition from native coaxial transmission line structure to band-limited waveguide interfaces. Thin shim transitions allow coaxial-to-waveguide mode conversion. Shims allow waveguide components to be attached to modules through a shim transition.

Figure 2A:
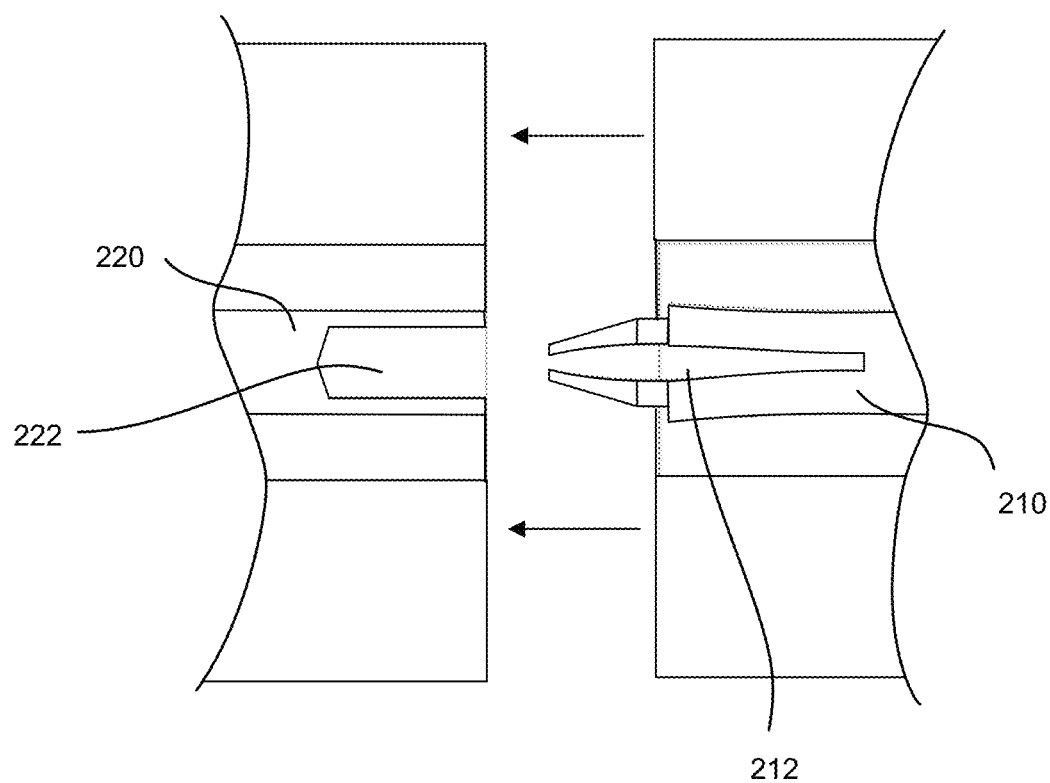
FIGS. 2A and 2B illustrates a slotted pin of a flange mount connector system in unengaged and engaged positions according to an embodiment.
Figure 2B:
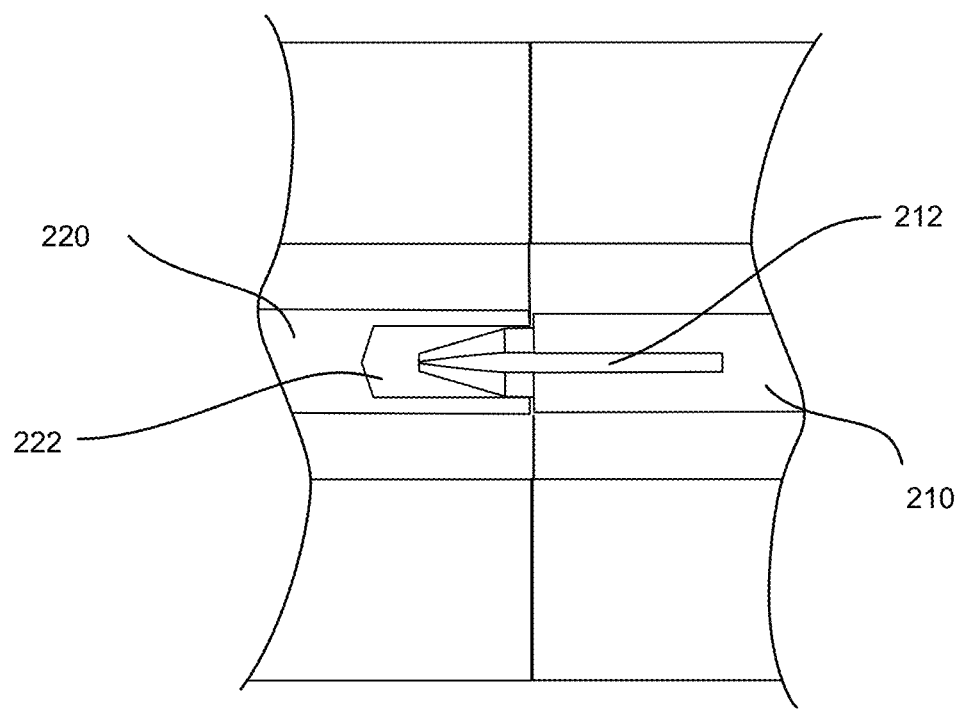

FIGS. 2A and 2B illustrates a central pin conductor comprising a slotted pin of a flange mount connector system in unengaged and engaged positions according to an embodiment. The flanges each comprise a central conductor (the flange itself provides the other conductor). The central conductor serves the same functions as the center wire of a coaxial cable). As shown in FIGS. 2A and 2B a single slot male pin of the center conductor 210 contact engages and makes electrical contact with a receiver 220 of the central conductor on the female side of the interface. This receiver does not have any slotting detail on the female side. The receiver (female side) has longitudinal hole/bore 222 at one end. A single slot 212 is cut in the male pin. The roles of the male and female contacts are reversed from the traditional resilient slotted contact design. The male pin is now the formed, slotted resilient contact. A male pin with a single slot maintains its strength since a minimal amount of material is removed by the single slot 212. Due to the spring constant of the material, the formed pin contact retains its formed shape when disengaged. The 'contact' strength of the resilient slotted pin can vary with the length of the slot. The longer the slot the lower the engage/disengage contact force required when mated.

As shown in FIG. 2B, the slotted male pin 210 is deformed to compress the slot 212 when the pin 210 is inserted into the bore 222 of the female receiver 220. Due to the spring constant of the material the side of the male pin a substantial contact force is exerted between the side of the male pin and the surface of the bore in the receiver. This ensures good electrical contact between the pin 210 and the receiver 220. A formed single slot male pin contact to electrically connect two center conductors of the same diameter to form a continuous impedance TEM transmission line structure with minimum signal reflection. The resilient slotted male pin contact compresses and maintains a DC connection with the mating center conductor through spring-like tension. When the assemblies are disconnected, the resilient, single slotted, formed male pin retains or 'springs-back' to its original shape. Note that because the connector is not rotated during assembly and disassembly there is reduce chance of damage or wear to the pin 210.

Figure 3A:
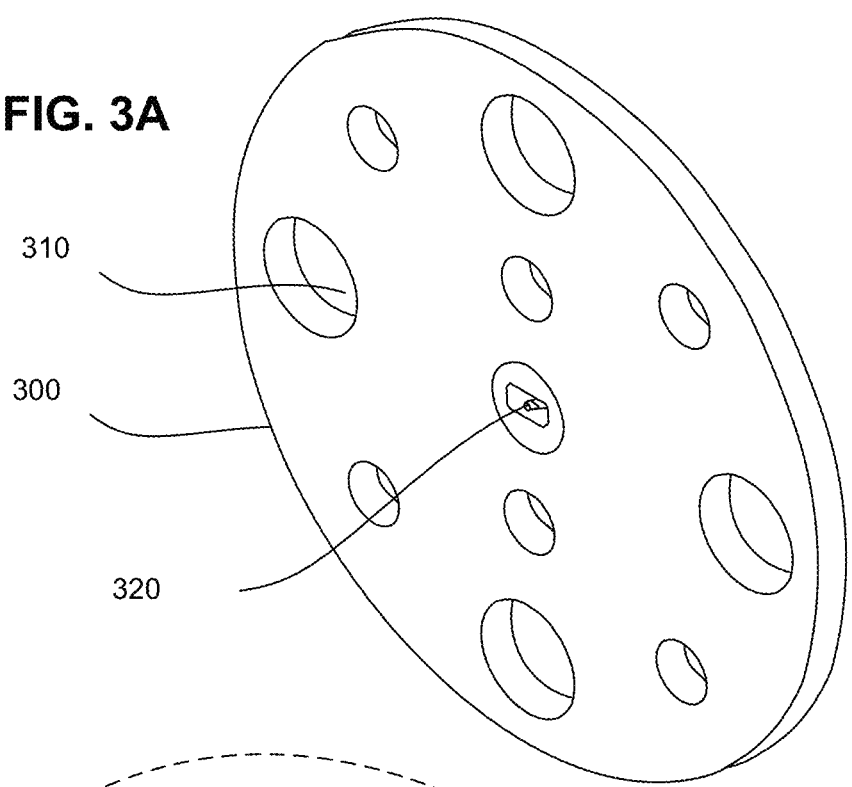
FIGS. 3A and 3B illustrates a mode transition shim and detailed view of the mode transition shim according to an embodiment.
Figure 3B:
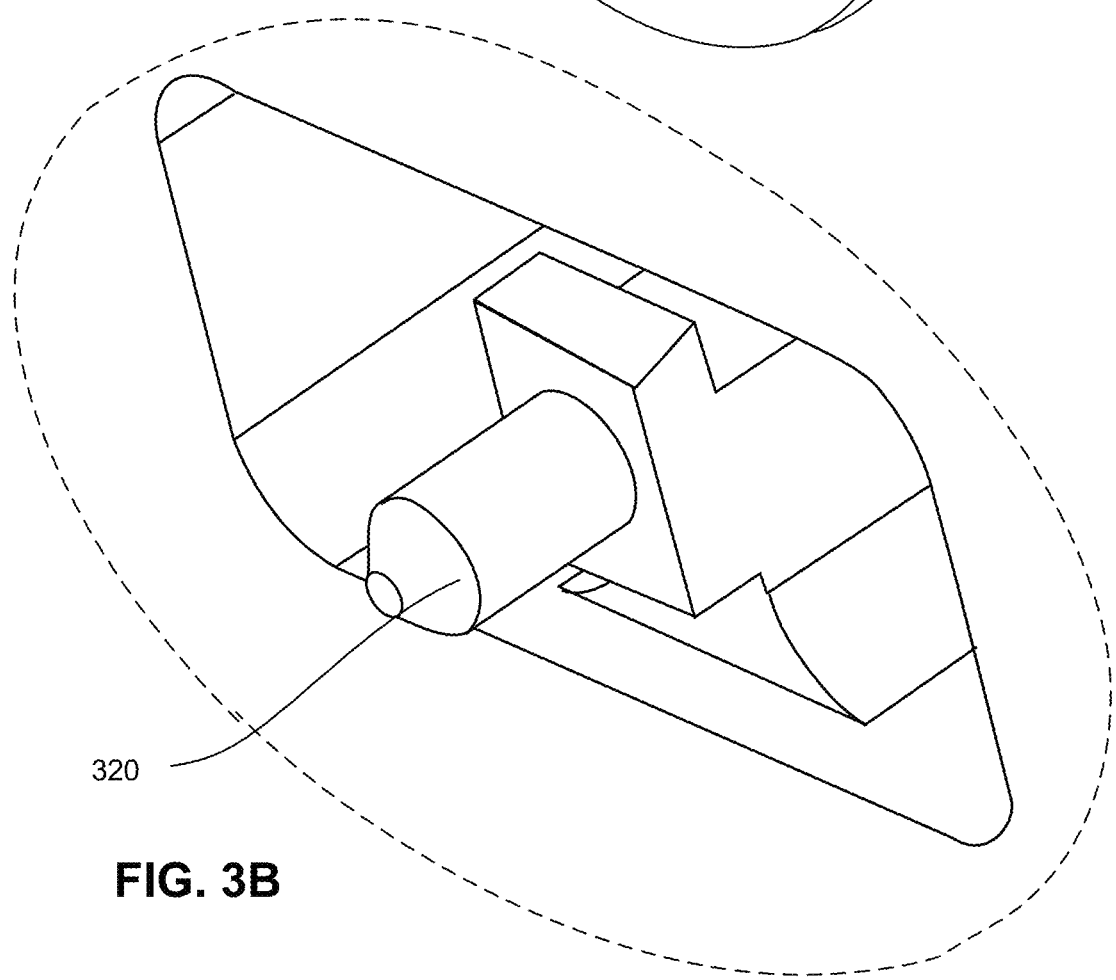

FIGS. 3A and 3B illustrates a mode transition shim and detailed view of the mode transition shim 300 according to an embodiment (see e.g. waveguide mode transition flange shim 126 of FIG. 1C). As shown in FIG. 3A the shim 300 comprises a plurality of through holes 310 for the alignment pins and mounting screws. At the center of the shim is a resilient contact 320. The contact pin 320 is shown in more detail in FIG. 3B. The coax to waveguide mode transition adapter facilitates TEM coaxial mode to TE10 waveguide mode conversion. This adapter interfaces with standard UG-387U and IEEE-1785-2a flange interfaces. Since this transition has an electrically highpass response, a DC connection is not required. Therefore an un-slotted pin 320 that 'slip-fits' into the mating center conductor is sufficient. The series capacitance between this un-slotted pin 320 and the mating center conductor provides enough coupling for frequencies in the waveguide band. The one-piece machined transition adapter shim 300 is electrically short, low loss and low cost. These transition adapters are scalable in frequency, limited only by the fabrication techniques used to produce the part.

Figure 4B:
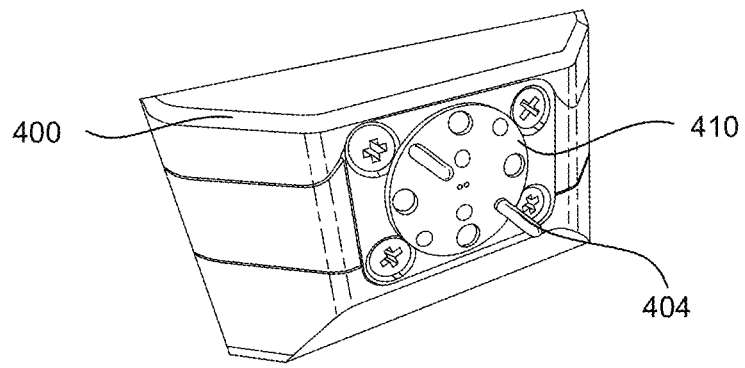
Figure 4C:
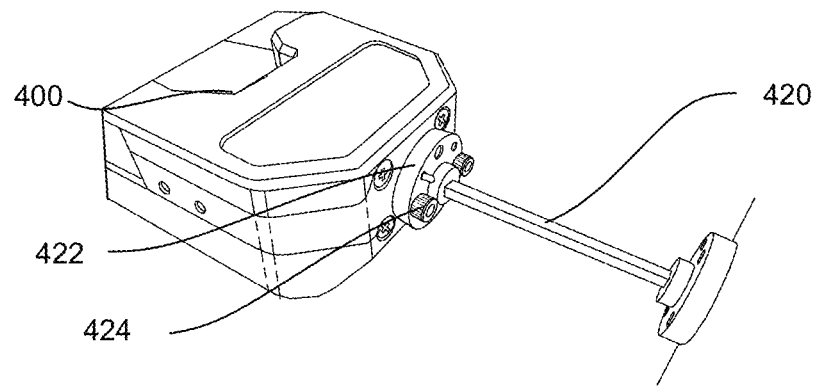

FIGS. 4A-4C illustrates assembly of a mode transition shim (as shown in FIGS. 3A and 3B) and waveguide assembly (FIG. 1C) with a flange mount connector system of a millimeter-wave module 400 according to an embodiment. FIG. 4A shows the interface 402 which comprises a pair of protruding pins 404 which engage bores in adapters mounted to the interface. The interface also includes threaded holes for receiving the mounting screws. FIG. 4B shows the one-piece machined transition adapter shim 410 placed on the interface and aligned by the pins 404 of the interface. FIG. 4C shows the flange 422 of the waveguide assembly 420 mounted to the interface by screws 424 with the shim captured between the waveguide assembly 420 and the interface 402.

Figure 5A:
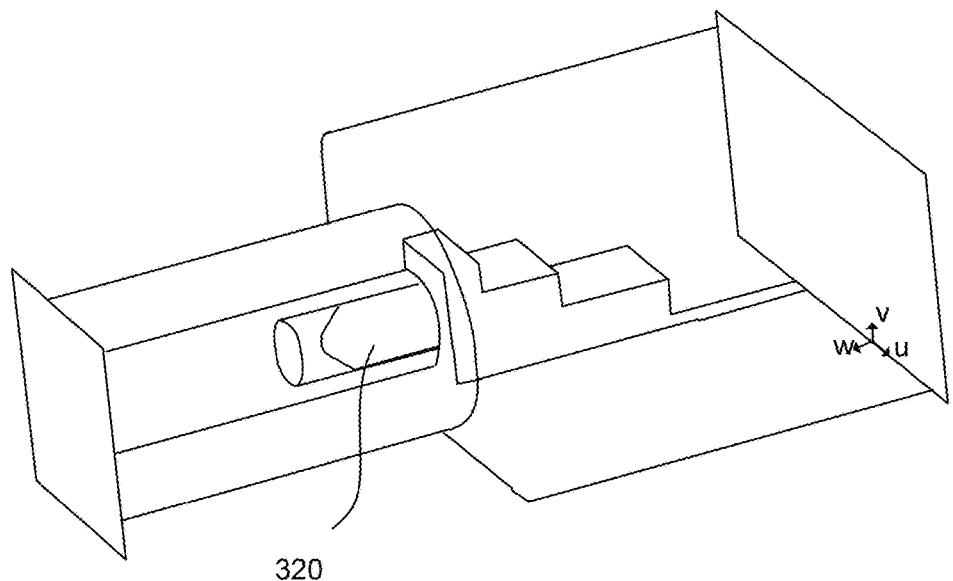
FIGS. 5A and 5B illustrates a pin connection and a graph of parameters of the connection according to an embodiment.
Figure 5B:
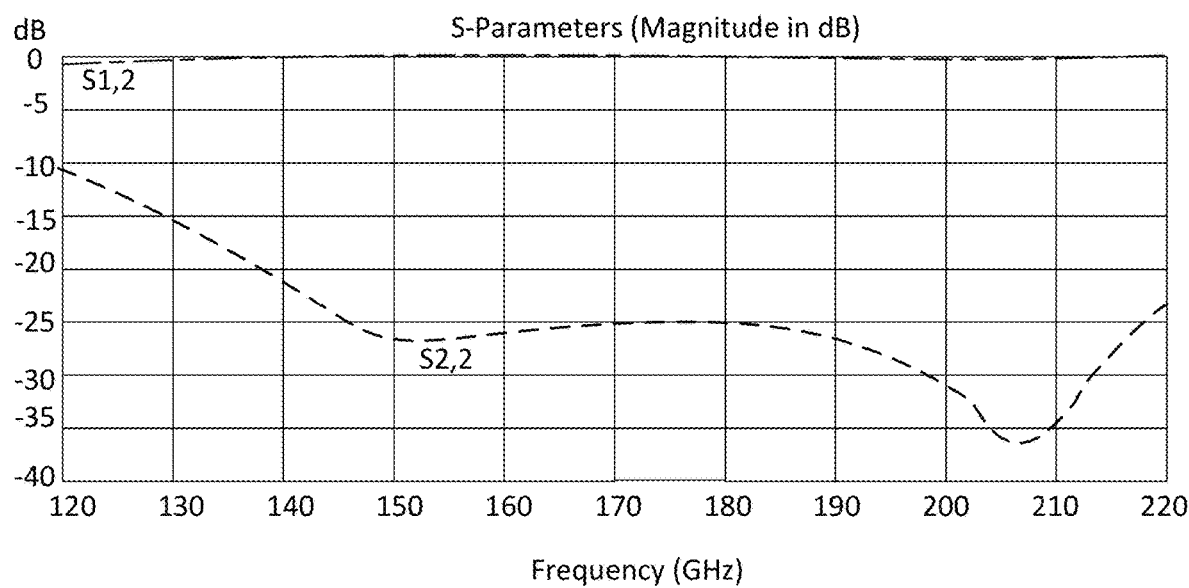

FIGS. 5A and 5B illustrates a pin connection and a graph of parameters of the connection according to an embodiment. FIG. 5A shows a 3D EM model of the DC open, non-contact "slip fit" pin used in the waveguide connector shim (FIG. 3B). FIG. 5B shows the frequency characteristics of the connector.

Figure 6A:
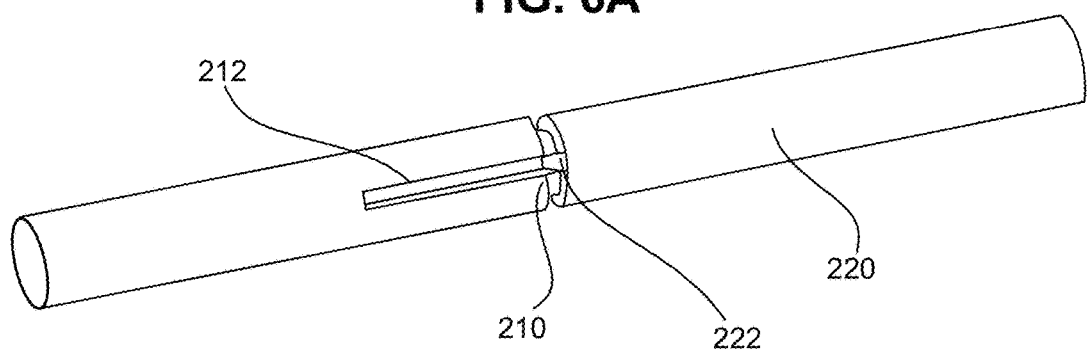
FIGS. 6A and 6B illustrates a pin connection and a graph of parameters of the connection according to an embodiment.
Figure 6B:
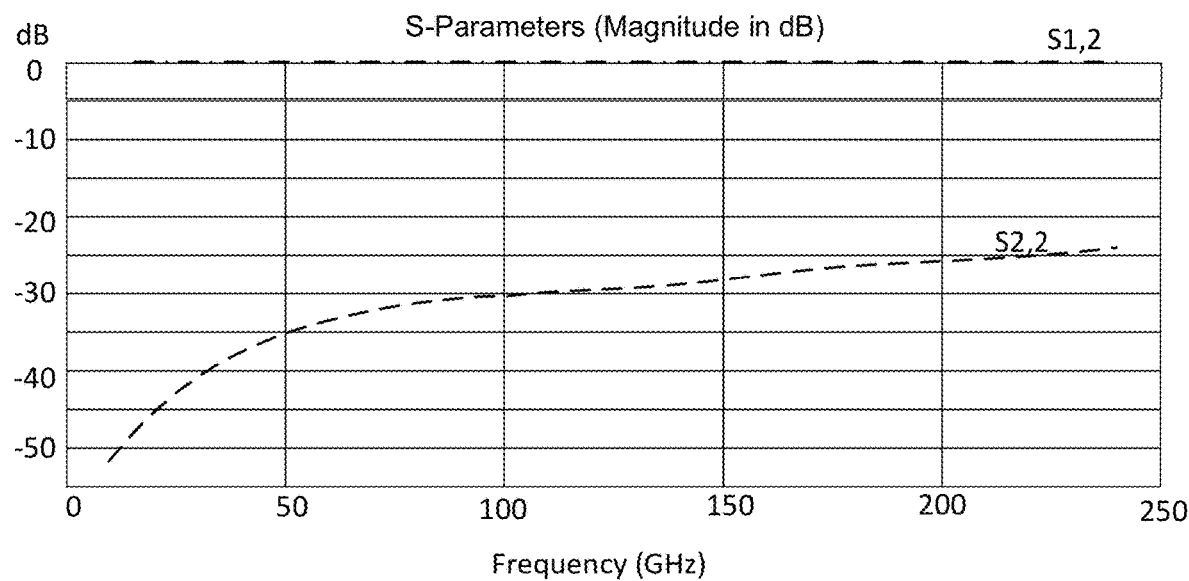

FIGS. 6A and 6B illustrates a pin connection and a graph of parameters of the connection according to an embodiment. FIG. 6A shows a 3D EM model of the slotted pin connector (FIG. 2A). FIG. 6B shows the frequency characteristics of the connector.

FIGS. 5A, 5B, 6A, and 6B show the flanged connectors effectively couple the millimeter wave module such as a vector network analyzer to the accessories such as a wafer probe, waveguide, and coaxial connector. Similar features may be readily incorporated and manufactured in adapters for other devices to be connected to the module. The design of the pin and the no-rotational engagement provides excellent repeatability and reduced wear such that the electrical characteristics of the connector are maintained through many mounting and un-mounting operations. The test results show that the interface provides better performance, repeatability and durability than conventional rotational coaxial connectors. In embodiments, the various adapters and other devices are used to couple the millimeter-wave module of e.g. a vector network analyzer to a device under test in order to characterize the device. Accordingly the performance, repeatability and durability of the connection provided by the present coupling improves reliability of the connection and therefore the characterization of devices under test.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

What is claimed is:

1. A flange mount coaxial connector system for connecting a millimeter-wave module to a device under test (DUT), the flange mount coaxial connector system comprising:
    a first flange having a first coaxial center conductor, a first pair of precision guiding pins and a first pair of pin bores;
    a second flange having a second coaxial center conductor, a second pair of precision guiding pins and a second pair of pin bores;
    a single slot male pin coupled to the first coaxial center conductor in the first flange;
    a female connector pin coupled to the second coaxial center conductor in the second flange and having a bore;
    wherein the precision guiding pins axially align the first and second flange when the first pair of precision guiding pins are received in the second pair of pin bores and the second pair of precision guiding pins are received in the first pair of pin bores; and
    wherein the first and second coaxial center conductors are electrically connected to each other by the single slot male pin and a female connector pin when the first flange and the second flange are fastened together.

2. The flange mount coaxial connector system of claim 1, wherein:
    the single slot male pin and the bore in the female connector pin mate to form an electrically conducting connection.

3. The flange mount coaxial connector system of claim 1, wherein:
    the single slot male pin compresses upon engagement with the bore of the female connector pin and maintains a DC connection with the female connector pin through spring-like tension, and wherein when the first flange and the second flange are disconnected, the resilient, single slotted, formed male pin retains or 'springs-back' to its original shape.

4. The flange mount coaxial connector system of claim 1, wherein:
    the single slot male pin compresses upon engagement with the bore of the female connector pin and maintains a DC connection with the female connector pin through spring-like tension; and wherein, when the first and second flange are disconnected, the single slot male pin springs-back to its uncompressed shape.

5. The flange mount coaxial connector system of claim 1, further comprising two screws configured to secure the first flange to the second flange.

6. The flange mount coaxial connector system of claim 1, wherein the first flange provides a connection interface to a millimeter wave module and the second flange provides an interface to a wafer probe.

7. The flange mount coaxial connector system of claim 1, wherein the first flange provides a connection interface to a millimeter wave module and the second flange provides an interface to a coaxial connector.

8. The flange mount coaxial connector system of claim 1, wherein the first flange provides a connection interface to a millimeter wave module and the second flange provides an interface to a wave guide.

9. The flange mount coaxial connector system of claim 1, wherein the first flange provides a connection interface to a millimeter wave module and the second flange provides an interface to a wave guide; and wherein the flange mount coaxial connector system further comprises a mode transition shim between the first flange and second flange.

\* \* \* \* \*